US010620487B2

(12) United States Patent
Wang et al.

(10) Patent No.: US 10,620,487 B2
(45) Date of Patent: Apr. 14, 2020

(54) PIXEL STRUCTURE, ARRAY SUBSTRATE, DISPLAY DEVICE AND METHOD FOR MANUFACTURING THE SAME (71) Applicant: BOE TECHNOLOGY GROUP CO., LTD., Beijing (CN)

(72) Inventors: Xiaolin Wang, Beijing (CN); Hui Zhang, Beijing (CN); Li Xiao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 6 days.

(21) Appl. No.: 15/135,776

(22) Filed: Apr. 22, 2016

(65) Prior Publication Data
US 2016/0313615 A1 Oct. 27, 2016

(30) Foreign Application Priority Data
Apr. 23, 2015 (CN) .......................... 2015 1 0198000

(51) Int. Cl.
H01L 27/12 (2006.01)
G02F 1/1343 (2006.01)
(Continued)

(52) U.S. Cl.
CPC .. G02F 1/134309 (2013.01); G02F 1/133345 (2013.01); G02F 1/136227 (2013.01);
(Continued)

(58) Field of Classification Search
CPC ....................... H01L 27/14605; H01L 27/1262
(Continued)

(56) References Cited

U.S. PATENT DOCUMENTS

2005/0219436 A1 10/2005 Kwon et al.
2009/0002618 A1 1/2009 Lee et al.
(Continued)

FOREIGN PATENT DOCUMENTS

CN 1677206 A 10/2005
CN 202339463 U 7/2012
(Continued)

OTHER PUBLICATIONS

First Office Action regarding Chinese Application No. 201510198000.1, dated Mar. 23, 2017. Translation provided by Dragon Intellectual Property Law Firm.
(Continued)

Primary Examiner — Julio J Maldonado
Assistant Examiner — Omar F Mojaddedi
(74) Attorney, Agent, or Firm — Harness, Dickey & Pierce, P.L.C.

(57) ABSTRACT

The present disclosure provides a pixel structure, an array substrate and a display device and a method for manufacturing the same. The pixel structure includes a pixel electrode layer and signal lines. The pixel electrode layer is divided into a plurality of domain display areas. Each domain display area includes a plurality of bar-like electrodes which extend with a given angle. The signal lines are in a layer different from the pixel electrode layer. Dividing lines of at least a part of the domain display areas in the pixel electrode layer are in areas covered by the signal lines.

19 Claims, 5 Drawing Sheets (51) Int. Cl.
*G02F 1/13* (2006.01)
*G02F 1/1362* (2006.01)
*G02F 1/1333* (2006.01)

(52) U.S. Cl.
CPC ...... *G02F 1/136286* (2013.01); *H01L 27/124* (2013.01); *H01L 27/1262* (2013.01); *G02F 2001/134345* (2013.01); *G02F 2001/136218* (2013.01)

(58) Field of Classification Search
USPC .......................................................... 257/72
See application file for complete search history.

(56) References Cited

U.S. PATENT DOCUMENTS

| | | | | |
|---|---|---|---|---|
| 2009/0086149 A1* | 4/2009 | Kim | ................. | G02F 1/134363 349/144 |
| 2013/0093658 A1* | 4/2013 | Park | ................... | G02F 1/13452 345/92 |
| 2013/0188109 A1 | 7/2013 | Chen | | |
| 2015/0077692 A1* | 3/2015 | Kim | ................. | G02F 1/133707 349/139 |
| 2015/0303123 A1* | 10/2015 | Choi | ................ | H01L 23/3192 257/72 |

FOREIGN PATENT DOCUMENTS

| | | |
|---|---|---|
| CN | 103018984 A | 4/2013 |
| CN | 103728797 A | 4/2014 |

OTHER PUBLICATIONS

Second Office Action regarding Application No. 201510198000.1 dated Nov. 7, 2017. English translation provided by http://globaldossier.uspto.gov.

* cited by examiner

PIXEL STRUCTURE, ARRAY SUBSTRATE, DISPLAY DEVICE AND METHOD FOR MANUFACTURING THE SAME

CROSS-REFERENCE TO RELATED APPLICATION

This application claims a priority to Chinese Patent Application No. 201510198000.1 filed on Apr. 23, 2015, the disclosures of which are incorporated in their entirety by reference herein.

TECHNICAL FIELD

The present disclosure relates to the field of liquid crystal display, and in particular to a pixel structure, an array substrate, a display device and a method for manufacturing the same.

BACKGROUND

A liquid crystal display panel generally consists of a color filter (CF) substrate and an array substrate. A percentage of a light-transmitting area of the CF substrate and the array substrate to a total display area, i.e., an aperture ratio, is a main factor that influences a transmittance of the liquid crystal display panel. A power consumption of the liquid crystal display panel and a manufacture cost thereof may be increased when the transmittance of the liquid crystal display panel is low.

A pixel layer is generally a top layer of the array substrate, which is configured to control an electric field so as to influence an arrangement of liquid crystal molecules. Generally, the design of the pixel layer may influence an optical property of the liquid crystal display panel (e.g., transmittance) and thereby influence display efficiency thereof.

SUMMARY

An objective of the present disclosure is to provide a pixel structure, an array substrate and a display device and a method for manufacturing the same, so as to improve display efficiency of the liquid crystal display panel.

In view of this, a pixel structure is provided in some embodiments of the present disclosure, including: a pixel electrode layer and signal lines. The pixel electrode layer is divided into a plurality of domain display areas, and each domain display area includes a plurality of bar-like electrodes. The signal lines are in a layer different from the pixel electrode layer. Dividing lines of at least a part of the domain display areas in the pixel electrode layer are in areas covered by the signal lines.

Optionally, the pixel structure further includes: a signal shielding layer between the signal line and the pixel electrode layer.

Optionally, the signal lines include data lines; dividing lines of at least a part of sub-pixels in the pixel electrode layer are in areas covered by the data lines.

Optionally, the signal lines further include gate lines; each sub-pixel includes a plurality of domain display areas, and dividing lines of at least a part of the domain display areas in each sub-pixel are in areas covered by the gate lines.

Optionally, patterns of the bar-like electrodes of the sub-pixels of the same color in two adjacent pixel units are mirror-symmetric.

Optionally, each sub-pixel includes two domain display areas adjacent to each other in a vertical direction, and patterns of the bar-like electrodes of the two domain display areas are mirror-symmetric.

Optionally, the bar-like electrodes of the two adjacent domain display areas extend in different directions.

In addition, an array substrate is further provided in some embodiments of the present disclosure, including the pixel structure hereinabove. The array substrate further includes a base substrate; a gate electrode and gate lines on the base substrate; a gate insulating layer covering the gate electrode and the gate lines; a semiconductor layer, a source electrode, data lines and a drain electrode on the gate insulating layer; a first insulating layer covering the semiconductor layer, the source electrode, the data lines and the drain electrode; a signal shielding layer on the first insulating layer; a second insulating layer covering the signal shielding layer. The pixel electrode layer is on the second insulating layer and electrically connected to the drain electrode, the signal line includes the gate line and the data line.

Optionally, the signal shielding layer is a transparent conductive layer.

Optionally, the transparent conductive layer is made of indium tin oxide (ITO).

Optionally, the pixel electrode layer is electrically connected to the drain electrode through a via-hole.

Optionally, dividing lines of at least a part of sub-pixels in the pixel electrode layer are in areas covered by the data lines; each sub-pixel includes a plurality of domain display areas, and dividing lines of at least a part of the domain display areas in each sub-pixel are in areas covered by the gate lines.

In addition, a display device including the array substrate hereinabove is further provided in some embodiments of the present disclosure.

In addition, a method for manufacturing an array substrate is further provided in some embodiments of the present disclosure, including a step of forming on a base substrate a pixel electrode layer and signal lines in such a manner that the signal lines are in a layer different from the pixel electrode layer. The pixel electrode layer is divided into a plurality of domain display areas, each domain display area includes a plurality of bar-like electrodes which extend with given angles. Dividing lines of at least a part of the domain display areas in the pixel electrode layer are in area covered by the signal lines.

Optionally, the method further includes: forming a signal shielding layer between the signal line and the pixel electrode layer.

According to the embodiments of the present disclosure, the dividing lines of at least a part of the domain display areas in the pixel electrode layer are in areas covered by the signal lines. The signal lines are in a non-display area of the liquid crystal display panel, so the liquid crystal molecules near the dividing lines of the domain display areas are not used for the display of the liquid crystal display panel and then do not influence adversely the display efficiency of the liquid crystal display panel.

DETAILED DESCRIPTION

In order to make the technical issues, the technical solutions and the advantages of the present disclosure more apparent, the present disclosure will be described in detail hereinafter in conjunction with the drawings and embodiments.

Figure 1:
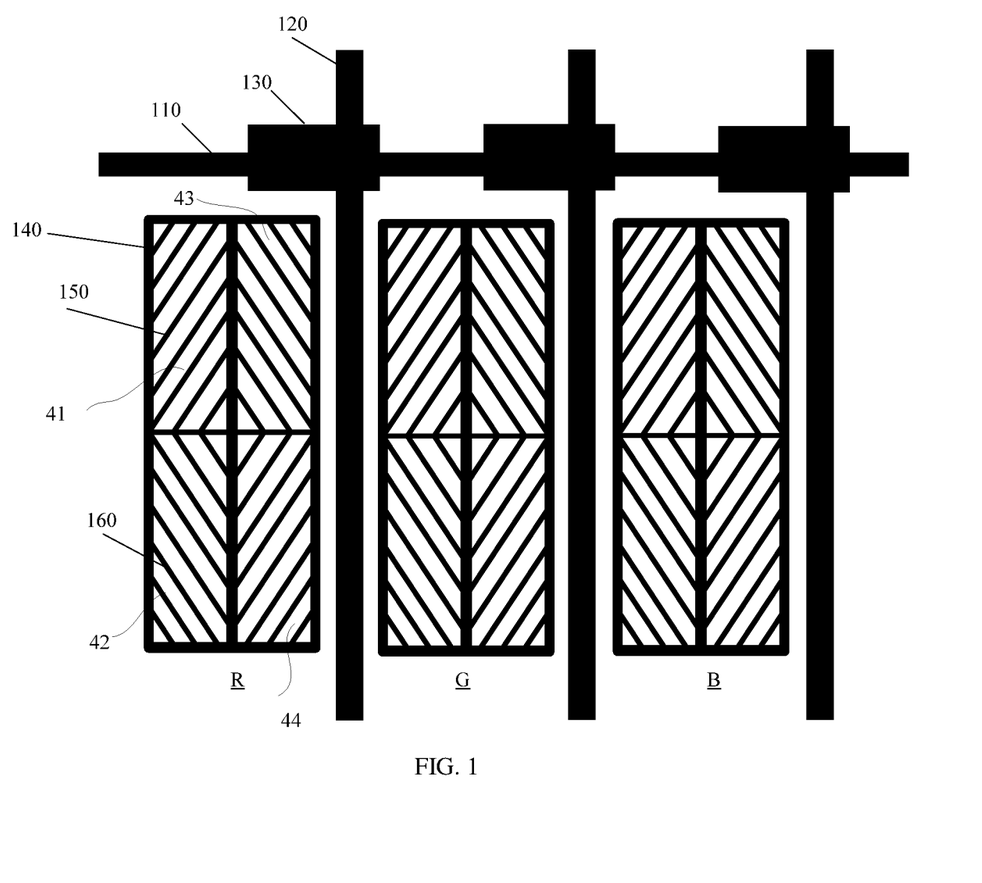
FIG. 1 is a schematic view showing a pattern of a pixel electrode layer of an array substrate.

FIG. 1 is a schematic view showing a pixel layer. The reference number 110 represents a gate line and a common line of a liquid crystal display panel. The reference number 120 represents a data line. The reference number 130 represents a thin film transistor (TFT) configured to control a display of a pixel. The reference number 140 represents an area of a pixel electrode of the pixel layer. The reference numbers 150 and 160 represent two groups of slit-like openings of a bar-like electrode and the two groups of slit-like openings extend in different directions.

When an image is displayed on the liquid crystal display panel, along with variation of the display content, a voltage applied to the pixel layer is changed continuously in response to a control of the TFT, and then an electric field between the pixel layer and the common electrode layer is changed, thereby electric filed lines which enter into a liquid crystal cell through the slit-like openings of the pixel layer are changed, and liquid crystal molecules are deflected along with the variation of the electric field.

There is an obvious color cast in the homeotropic-alignment liquid crystal display, i.e., a display effect may vary with a viewing angle (e.g., viewing from the front and the side of the liquid crystal display panel). In order to enlarge a range of the viewing angle and weaken the color cast, a bar-like electrode pattern in a multi-domain display area (reference numbers 41, 42, 43, 44 in FIG. 1) is provided, as shown in FIG. 1. Different voltages are applied to the domain display areas, so as to deflect the liquid crystal molecules to different extents, thereby a display property of the liquid crystals may be an average of an integral of display properties of the liquid crystals in the domain display areas, such that the difference cause by viewing the liquid crystal display device from different angles may be reduced, and the range of view angel may be enlarged.

A dividing line of the domain display areas is an area where merely inflection points of structures like "<" are located. As shown in FIG. 1, a structure like "<" is formed by areas 41 and 43, so a dividing line of the two areas is just a dividing line of the domain display areas. In a pixel structure in the related art, the dividing line of the domain display areas in the pixel electrode layer is arranged in a pixel area, the liquid crystal molecules near the dividing line of the domain display areas are subjected to electric filed forces from different directions and thereby rotated slowly during the display, so the display efficiency of the liquid crystal display panel is influenced adversely.

In view of this, a pixel structure is provided in some embodiments of the present disclosure, which includes a pixel electrode layer and a signal line. The signal line is arranged in a layer different from the pixel electrode layer. The pixel electrode layer is divided into a plurality of domain display areas. Each domain display area includes a plurality of bar-like electrodes which extend with a given angle. Dividing lines of at least a part of the domain display areas in the pixel electrode layer are arranged in an area covered by the signal line.

As compared with the solution shown in FIG. 1, in the pixel structure in some embodiments of the present disclosure, the dividing lines of at least a part of the domain display areas in the pixel electrode layer are arranged in an area covered by the signal line. The signal line is in a non-display area of the liquid crystal display panel, so the liquid crystal molecules near the dividing lines of the domain display areas are not used for the display of the liquid crystal display panel and then do not influence adversely the display efficiency of the liquid crystal display panel.

The pixel structure will be described in detail in conjunction with the embodiments.

Figure 2:
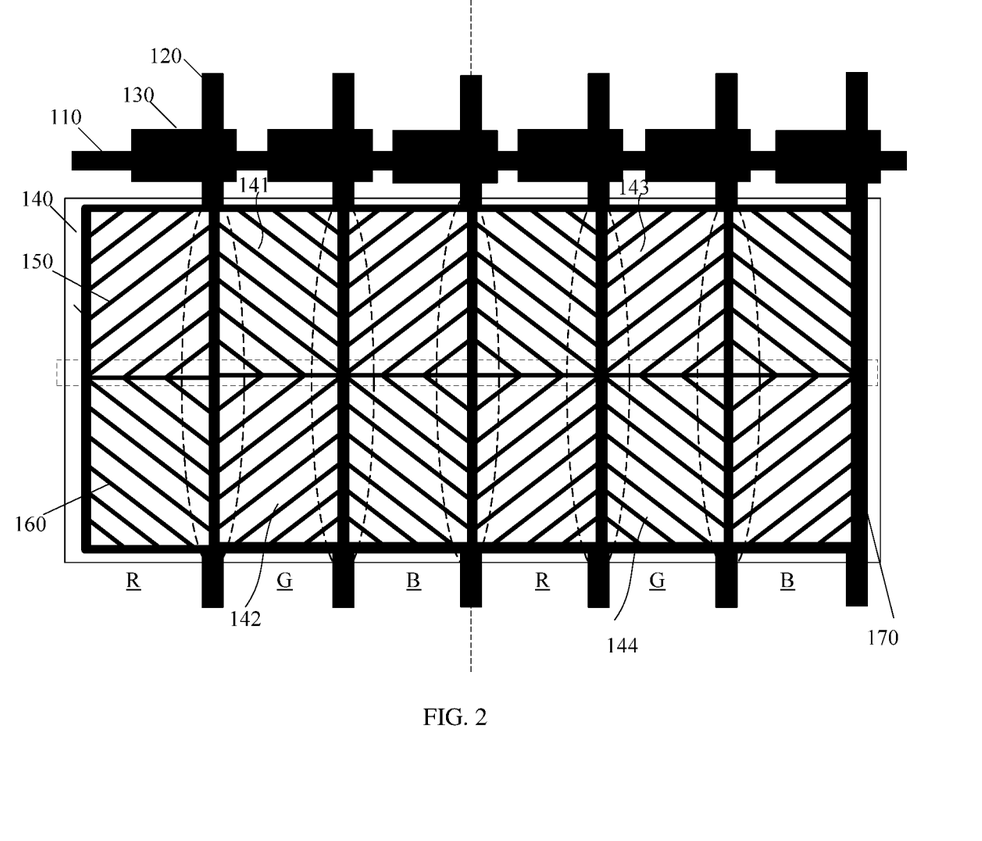
FIGS. 2-4 are schematic views showing some pixel electrode structures according to some embodiments of the present disclosure.

The pixel structure in some embodiments of the present disclosure is shown in FIG. 2, including two pixel units adjacent to each other in a horizontal direction. Each pixel unit includes a sub-pixel R, a sub-pixel G and a sub-pixel B. Of course, two pixel units adjacent to each other in the vertical direction are also applicable, and the description thereof is omitted herein.

The signal line of the pixel electrode may be a data line 120. The area defined by the elliptical dotted line represents a dividing line of the two domain display areas adjacent to each other in the horizontal direction, and this dividing line is arranged in an area covered by the data line 120. The area defined by the rectangular dotted line represents a dividing line of the two domain display areas adjacent to each other in the vertical direction, which is arranged in the pixel area. In addition, a dividing line of the sub-pixels is also arranged in the area covered by the data line 120, i.e., the dividing lines of the sub-pixels are overlapped with or very close to the dividing lines of the domain display areas.

In some embodiments of the present disclosure, the dividing lines of the two domain display areas adjacent to each other in the horizontal direction and the dividing line of the two sub-pixels are both arranged in the area covered by the data line 120, thereby reducing intervals between the adjacent sub-pixels and increasing an aperture ratio to some extent.

In addition, when a data signal is generated in the data line 120, an electric field interference may occur, and the liquid crystal molecules corresponding to a position nearby may be influenced and then rotated. In order to prevent the rotation of the liquid crystal molecules corresponding to the position near the data line 120 from being interfered by the electric field generated by the data line 120, the pixel structure may further include a signal shielding layer 170 configured to space the data line 120 from the pixel electrode layer. To be specific, the signal shielding layer 170 may be a transparent conductive layer. The transparent conductive layer serves as a conductor and can eliminate in a coupling manner the signal interference generated on the data line 120.

In a practical pixel structure, the transparent conductive layer may be insulated from the data line by a first insulating layer, and the transparent conductive layer may be insulated from the pixel electrode layer by a second insulating layer.

In addition, as shown in FIG. 2, in order to prevent an occurrence of color cast in the horizontal direction, patterns of the bar-like electrodes of the sub-pixels of the same color are mirror-symmetric. Similarly, in order to prevent an occurrence of color difference in the vertical direction, each sub-pixel is divided into two domain display areas adjacent to each other in the vertical direction (or a plurality of domain display areas adjacent to one another in the vertical direction), and patterns of the bar-like electrodes of the two domain display areas are mirror-symmetric. Taking the green sub-pixel (i.e., the sub-pixel G) as an example, the two green sub-pixels in FIG. 2 are divided into four domain display areas (i.e., domain display areas 141, 142, 143, 144). The domain display areas 141 and 143 are mirror-symmetric in the horizontal direction, and domain display areas 142 and 144 are mirror-symmetric in the horizontal direction. The domain display areas 141 and 142 are mirror-symmetric in the vertical direction, and domain display areas 143 and 144 are mirror-symmetric in the vertical direction.

It should be noted that, the mirror symmetry is merely one of the feasible solutions, and the present disclosure is not limited herein.

It can seen that, according to some embodiments of the present disclosure, a color difference due to a change of viewing angle may be improved as the solution shown in FIG. 1. However there is only one dividing line of the domain display areas in one sub-pixel, so the display efficiency is higher.

Figure 3:
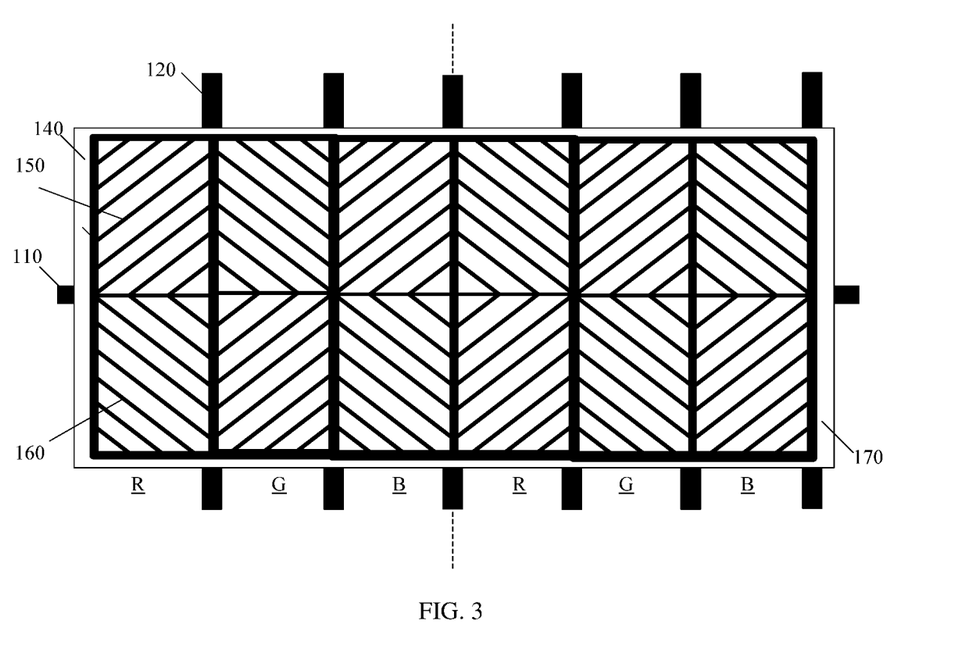

In some embodiments of the present disclosure, the signal line further includes a gate line. As shown in FIG. 3, in some embodiments of the present disclosure, in each sub-pixel, the dividing line of two domain display areas adjacent to each other in the vertical direction is arranged in an area covered by the gate line 110.

In some embodiments of the present disclosure, the dividing lines of all the domain display areas are arranged in the non-display area, thereby further improving the display efficiency of the liquid crystal display panel.

In addition, the gate line also generates some electric field interference which may influence rotation of the liquid crystal molecules in the display area nearby. In order to eliminate the influence, as same as the solution where the signal interference generated on the data line 120 is eliminated in a coupling manner, a signal shielding layer is arranged between the pixel electrode layer and the gate line 110. The signal shielding layer may be a transparent conductive layer, which may serve as a conductor and eliminate in a coupling manner the signal interference generated on the gate line 110. In a practical pixel structure, the transparent conductive layer may be insulated from the gate line 110 by a first insulating layer, and the transparent conductive layer may be insulated from the pixel electrode layer by a second insulating layer.

Of course, in practical application, the electric filed of the pixel electrode layer may not be interfered as long as a signal shielding layer is arranged between the pixel electrode layer and the proximal signal line. Taking a bottom-gate pixel structure as an example, the data line is nearer to the pixel electrode layer than the gate line, therefore the signal shielding layer is arranged between the data line and the pixel electrode layer. Similarly, in a top-gate pixel structure, the gate line is nearer to the pixel electrode layer than the data line, therefore the signal shielding layer is arranged between the gate line and the pixel electrode layer.

Figure 4:
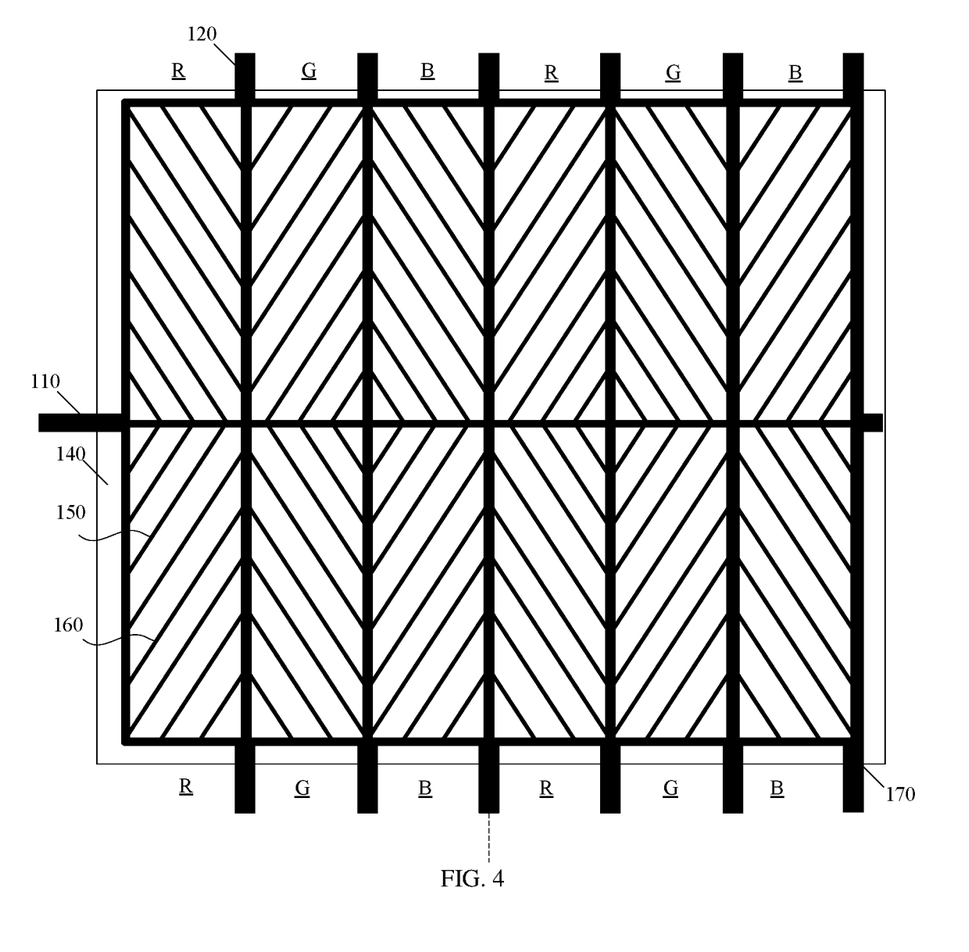

It should be noted that, the above embodiments are optional solutions where the dividing lines of the domain display areas are arranged in the area covered by the signal line, but the patterns of the bar-like electrodes in the pixel structure is not limited herein and the number of the domain display areas included in one sub-pixel is not limited herein. For example, as shown in FIG. 4, each sub-pixel may serve as a domain display area, the dividing line of two domain display areas adjacent to each other in the vertical direction is arranged in the area covered by the gate line 110, and the dividing line of two domain display areas adjacent to each other in the horizontal direction is arranged in the area covered by the data line 120.

To sum up, as compared with the solution shown in FIG. 1, the display efficiency of the liquid crystal display panel and the aperture ratio thereof may be improved significantly according to the pixel structure in some embodiments of the present disclosure.

In addition, an array substrate is further provided in some embodiments of the present disclosure, including the pixel structure hereinabove, by which a high aperture ratio and high display efficiency may also be achieved.

In some embodiments of the present disclosure, a signal shielding layer is arranged between the pixel electrode layer and the signal line of the array substrate, by which an electric field interference of the signal line may be shielded.

Optionally, the signal line hereinabove may be a data line or a gate line. In a bottom-gate TFT, the data line is nearer to the pixel electrode layer than the gate line, so it is merely required to shield the signal of the data line, i.e., merely a signal shielding layer is arranged between the data line and the pixel electrode layer. Similarly, in a top-gate TFT, the gate line is nearer to the pixel electrode layer than the data line, so it is merely required to shield the signal of the gate line, i.e., merely a signal shielding layer is arranged between the gate line and the pixel electrode layer.

To be specific, the signal shielding layer may be a transparent conductive layer, which may serve as a conductor and eliminate in a coupling manner the interference generated on the signal line.

Taking a bottom-gate array substrate as an example, an arrangement of the transparent conductive layer on the array substrate will be described hereinafter.

Figure 5:
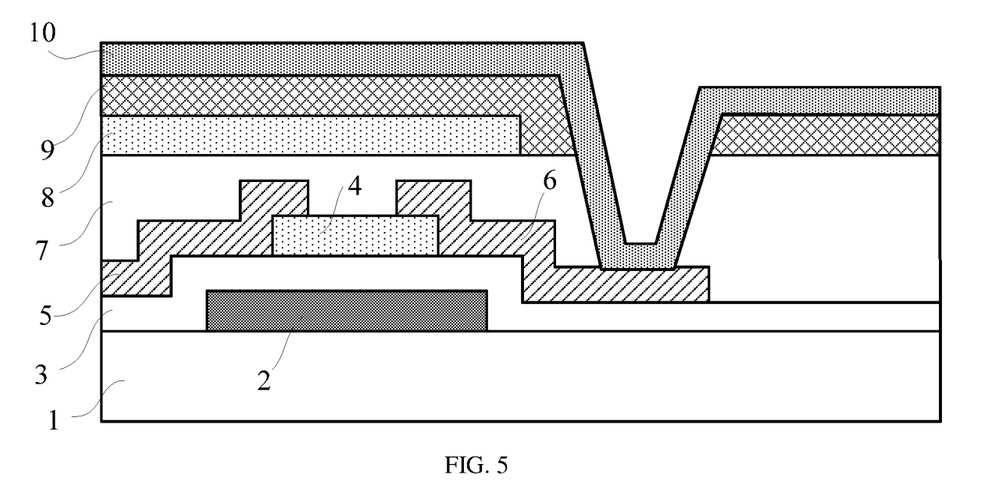
FIG. 5 is a schematic view showing an array substrate in which a transparent electrode layer is arranged between a pixel electrode layer and a data line according to some embodiments.

As shown in FIG. 5, the array substrate in some embodiments of the present disclosure includes: a base substrate 1; a gate electrode 2 and a gate line on the base substrate 1; a gate insulating layer 3 covering the gate electrode 2 and the gate line; a semiconductor layer 4, a source electrode 5, a data line (which is connected to the gate line and is not shown in FIG. 5) and a drain electrode 6 arranged on the gate insulating layer 3; a first insulating layer 7 covering the semiconductor layer 4, the source electrode 5, the data line and the drain electrode 6; a transparent conductive layer 8 arranged on the first insulating layer 7, where the transparent conductive layer 8 may be made of ITO to eliminate the signal of the data line; a second insulating layer 9 covering the transparent conductive layer 8, configured to insulate the transparent conductive layer 8 from the pixel electrode layer 10; and the pixel electrode layer 10 arranged on the second insulating layer 9, where the pixel electrode layer 10 is connected to the drain electrode 6 through via-holes.

The structure shown in FIG. 5 is merely a feasible solution of the array substrate in some embodiments of the present disclosure, which describes a position relation of the transparent conductive layer, the data line and the pixel electrode layer. The array substrates of other structures (e.g., a top-gate array substrate, a solution where the pixel electrode is not connected to the drain electrode through the via-holes) will not be described.

In addition, a display device including the array substrate hereinabove is further provided in some embodiments of the present disclosure, which may be a cell phone, a PAD, a television and so on and having high display efficiency.

In addition, a method for manufacturing an array substrate is further provided in some embodiments of the present disclosure, including a step of forming on a base substrate a pixel electrode layer and a signal line. The pixel electrode layer is divided into a plurality of domain display areas. Each domain display area includes a plurality of bar-like electrodes which extend with a given angle. The signal line is arranged in a layer different from the pixel electrode layer. Dividing lines of at least a part of the domain display areas in the pixel electrode layer are arranged in an area covered by the signal line.

In the array substrate manufactured by the method in some embodiments of the present disclosure, the dividing lines of at least a part of the domain display areas in the pixel electrode layer are arranged in the area which overlaps the signal line in a direction perpendicular to the array substrate. The signal line is arranged in the non-display area of the liquid crystal display panel, so the liquid crystal molecules corresponding to the dividing lines are not used for the display of the liquid crystal display panel and then do not influence adversely the display efficiency of the liquid crystal display panel.

In addition, in order to prevent the liquid crystal molecules in the display area from being interfered by the electromagnetic interference of the signal line and influencing the rotation of the liquid crystal molecules, optionally, the method in some embodiments of the present disclosure further includes a step of forming a signal shielding layer between the signal line and the pixel electrode layer.

From the above description, according to the method in some embodiments of the present disclosure, the electric field interference generated by the signal line may be counteracted by the signal shielding layer.

The above are merely the optional embodiments of the present disclosure. A person skilled in the art may make further modifications and improvements without departing from the principle/spirit of the present disclosure, and these modifications and improvements shall also fall within the scope of the present disclosure.

What is claimed is:

1. A pixel structure, comprising:
   a pixel electrode layer including a plurality of subpixels;
   a plurality of first signal lines in a layer different from the pixel electrode layer and extending along a first direction; and
   a signal shielding layer between the first signal lines and the pixel electrode layer;
   wherein each dividing line between every two subpixels adjacent in a second direction is in an area covered by the first signal lines;
   the first direction is perpendicular to the second direction; and
   each dividing line between every two subpixels adjacent in the second direction has a first width in the second direction, each of the first signal lines has a second width in the second direction, and the first width is less than the second width.

2. The pixel structure according to claim 1, wherein the first signal lines are data lines.

3. The pixel structure according to claim 1, further comprising a plurality of second signal lines in a layer different from the pixel electrode layer;
   wherein the second signal lines extend along the second direction;
   wherein each dividing line between every two subpixels adjacent in the first direction is in an area covered by the second signal lines; and
   wherein each dividing line between every two subpixels adjacent in the first direction has a third width in the first direction, each of the second signal lines has a fourth width in the first direction, and the third width is less than the fourth width.

4. The pixel structure according to claim 3, wherein the first signal lines are data lines, and the second signal lines are gate lines.

5. The pixel structure according to claim 3, wherein the signal shielding layer is between the pixel electrode layer and the second signal lines.

6. The pixel structure according to claim 1, further comprising a plurality of second signal lines in a layer different from the pixel electrode layer;
   wherein the second signal lines extend along the second direction;
   wherein each of the subpixels is divided into a plurality of domain display areas in the first direction, and each dividing line between every two domain display areas in each of the subpixels is in an area covered by the second signal lines.

7. The pixel structure according to claim 6, wherein the first signal lines are data lines, and the second signal lines are gate lines.

8. The pixel structure according to claim 1, wherein the signal shielding layer is a transparent conductive layer.

9. The pixel structure according to claim 8, wherein the transparent conductive layer is made of indium tin oxide.

10. An array substrate, comprising the pixel structure according to claim 1.

11. The pixel structure according to claim 1, wherein each dividing line between every two subpixels adjacent in a second direction is entirely in the area covered by the first signal lines.

12. The pixel structure according to claim 3, wherein each dividing line between every two subpixels adjacent in the first direction is entirely in the area covered by the second signal lines.

13. An array substrate, comprising: a pixel structure;
    wherein the pixel structure comprises:
    a pixel electrode layer including a plurality of subpixels;
    a plurality of first signal lines in a layer different from the pixel electrode layer and extending along a first direction; and
    a plurality of second signal lines in a layer different from the pixel electrode layer and extending along a second direction different from the first direction;
    wherein each dividing line between every two subpixels adjacent in the second direction is in an area covered by the first signal lines;
    wherein each dividing line between every two subpixels adjacent in the first direction is in an area covered by the second signal lines; and
    wherein the first direction is perpendicular to the second direction;
    wherein each dividing line between every two subpixels adjacent in the second direction has a first width in the second direction, each of the first signal lines has a second width in the second direction, and the first width is less than the second width; and
    wherein each dividing line between every two subpixels adjacent in the first direction has a third width in the first direction, each of the second signal lines has a fourth width in the first direction, and the third width is less than the fourth width.

14. The array substrate according to claim 13, wherein the first signal lines are data lines, and the second signal lines are gate lines.

15. The array substrate according to claim 14, further comprising a signal shielding layer between the pixel electrode layer and each of the first signal lines and the second signal line.

16. The array substrate according to claim 15, wherein the signal shielding layer is a transparent conductive layer.

17. The array substrate according to claim 16, wherein the transparent conductive layer is made of indium tin oxide.

18. A display device, comprising the array substrate according to claim 13.

19. The array substrate according to claim 13, wherein each dividing line between every two subpixels adjacent in the second direction is entirely in the area covered by the first signal lines; and each dividing line between every two subpixels adjacent in the first direction is entirely in the area covered by the second signal lines.

\* \* \* \* \*